US006803512B2

(12) United States Patent
Ishida et al.

(10) Patent No.: US 6,803,512 B2
(45) Date of Patent: Oct. 12, 2004

(54) MUSICAL TONE GENERATING APPARATUS, PLUCKED STRING INSTRUMENT, PERFORMANCE SYSTEM, ELECTRONIC MUSICAL INSTRUMENT, MUSICAL TONE GENERATION CONTROL METHOD, AND PROGRAM FOR IMPLEMENTING THE METHOD

(75) Inventors: Kenji Ishida, Shizuoka-ken (JP); Yoshitaka Masumoto, Aichi-ken (JP); Kenichi Miyazawa, Iwata-gun (JP); Yoshiki Nishitani, Shizuoka-ken (JP)

(73) Assignee: Yamaha Corporation, Shizuoka-ken (JP)

(*) Notice: Subject to any disclaimer, the term of this patent is extended or adjusted under 35 U.S.C. 154(b) by 0 days.

(21) Appl. No.: 10/458,908

(22) Filed: Jun. 11, 2003

(65) Prior Publication Data

US 2003/0230187 A1 Dec. 18, 2003

(30) Foreign Application Priority Data

Jun. 17, 2002 (JP) ....................................... 2002-176009

(51) Int. Cl.[7] ............................ G10H 1/46; G10H 7/00; H03G 3/00

(52) U.S. Cl. ........................................ 84/633; 84/464 A

(58) Field of Search ........................... 84/464 A, 464 R, 84/477 R, 478, 633

(56) References Cited

U.S. PATENT DOCUMENTS 6,037,534 A 3/2000 Yasutoshi et al.
6,180,865 B1 * 1/2001 Ishiguro ...................... 84/609
6,586,666 B2 7/2003 Abe
6,624,348 B1 * 9/2003 Matsutsuka .................. 84/719

* cited by examiner

*Primary Examiner*—Jeffrey W Donels
(74) *Attorney, Agent, or Firm*—Harness, Dickey & Pierce, PLC

(57) ABSTRACT

There is provided a musical tone generating apparatus which enables beginners inexperienced in musical performance and like players to play a musical instrument such as an electronic harp without practicing repeatedly. The musical instrument has a plurality of operating elements such as strings to which a plurality of musical tones are assigned, respectively. Musical tones are generated in response to operations of the operating elements. Ones of the musical tones, assigned to ones of said operating elements which are not to be operated are muted.

12 Claims, 10 Drawing Sheets

MUSICAL TONE GENERATING APPARATUS, PLUCKED STRING INSTRUMENT, PERFORMANCE SYSTEM, ELECTRONIC MUSICAL INSTRUMENT, MUSICAL TONE GENERATION CONTROL METHOD, AND PROGRAM FOR IMPLEMENTING THE METHOD

BACKGROUND OF THE INVENTION

1. Field of the Invention

The present invention relates to a musical tone generating apparatus, a plucked string instrument, a performance system, an electronic musical instrument, and a musical tone generation control method that generate various musical tones according to operation of operating elements, as well as a program for implementing the method.

2. Description of the Related Art

Recently, the field of electronic musical instruments has seen widespread use of electronic musical instruments equipped with a so-called performance support function which enables even beginners without knowledge of musical codes, such as MIDI (Musical Instruments Digital Interface) codes, or without experience in practicing an acoustic musical instrument, to play the electronic musical instrument with ease.

A description will be given of the performance support function, taking an automatic piano as an example. The automatic piano has a plurality of light-emitting elements arranged at respective locations corresponding to the keys thereof, and ones of the light-emitting elements corresponding to keys to be depressed are lit in accordance with the progress of performance of a piece of music. The player sequentially depresses keys corresponding to light-emitting elements lit which are sequentially and selectively lit. This causes musical tones corresponding to the depressed keys to be output through a loudspeaker or the like. Thus, the performance of the piece of music is given using the automatic piano.

By utilizing the performance support function described above, even inexperienced beginners or like players can play a musical instrument equipped with the function to some extent. However, such players are apt to play the musical instrument by gazing at the light-emitting elements for ones sequentially lit, in order not to depress wrong keys, and therefore have difficulty in playing in proper rhythm. This prevents the players from achieving satisfactory performance. In other words, even if the performance support function is utilized, the inexperienced players cannot play satisfactorily unless they practice repeatedly.

SUMMARY OF THE INVENTION

It is an object of the present invention to provide a musical tone generating apparatus, a plucked string instrument, a performance system, and an electronic musical instrument, a musical tone generation control method which enable beginners inexperienced in musical performance and like players to play a musical instrument without practicing repeatedly, as well as a program for implementing the method.

To attain the above object, in a first aspect of the present invention, there is provided a musical tone generating apparatus comprising a plurality of operating elements to which a plurality of musical tones are assigned, respectively, a musical tone-generating device that generates the musical tones, in response to operations of the operating elements to which the musical tones are assigned, respectively, and a mute device that mutes ones of the musical tones assigned ones of the operating elements which are not to be operated.

With the above arrangement according to the first aspect of the present invention, the mute device mutes ones of the musical tones assigned to ones of the operating elements which are not to be operated. Therefore, even if the player operates ones of the operating elements which are to be operated and at the same time accidentally operates ones of the operating elements which are not to be operated, musical tones assigned to the ones of the operating elements which are not to be operated are not sounded. This enables even beginners quite inexperienced in performance of pieces of music to play properly, which makes it possible to solve the problem that players incapable of playing a musical instrument as intended are fed up with playing the instrument to give up playing the same.

Preferably, the musical tone generating apparatus according to the first aspect further comprises a notification device that notifies ones of the operating elements which are to be operated, and the mute device mutes ones of the musical tones assigned to other ones of the operating elements than the ones of the operating elements which are to be operated, notified by the notification device.

With the above preferable arrangement, the notification device notifies the player of ones of the operating elements which are to be operated. This enables the player to recognize the ones of the operating elements which are to be operated according to information notified by the notification device (e.g. numbers indicative of the ones of the operating elements which are to be operated), thereby making it possible to solve the problem that the player operates the ones of the operating elements which are not to be operated.

More preferably, the notification device notifies the ones of the operating elements which are to be operated and timing of operations thereof in accordance with progress of performance of a piece of music, and the mute device mutes the ones of the musical tones assigned to the other ones of the operating elements than the of the operating elements which are to be operated, notified by the notification device, over a predetermined time period.

With the above more preferable arrangement, the notification device notifies the player of the ones of the operating elements which are to be operated and timing of operations thereof in accordance with the progress of performance of a piece of music. This enables the player to recognize both the ones of the operating elements which are to be operated and the timing of operations thereof, thereby making it possible for the player to play pieces of music accurately in rhythm.

To attain the above object, in a second aspect of the present invention, there is provided a plucked string instrument comprising a musical tone-generating device including a plurality of strings, the musical tone-generating device generating musical tones corresponding to ones of the strings which are operated, respectively, and a mute device that mutes ones of the musical tones corresponding to ones of the strings which are not to be plucked.

Preferably, the plucked string instrument further comprises a notification device that notifies ones of the strings which are to be plucked, and the mute device mutes ones of the musical tones corresponding to other ones of the strings than the ones of the strings which are to be plucked, notified by the notification device.

More preferably, the notification device notifies the ones of the strings which are to be plucked and timing of plucking thereof in accordance with progress of performance of a piece of music, wherein the mute device mutes ones of the musical tones corresponding to the other ones of said strings than the ones of said strings which are to be plucked, notified by said notification device, over a predetermined time period.

To attain the above object, in a third aspect of the present invention, there is provided a performance system comprising a plucked string instrument including a plurality of strings, the plucked string instrument generating musical tones corresponding to ones of the strings which are operated, respectively, and a musical tone generation control apparatus that generates chord information indicative of chords to be sounded by the plucked string instrument, wherein the musical tone generation control apparatus includes a transmitter device that transmits the generated chord information to the plucked string instrument, and wherein the plucked string instrument includes a musical tone generation control device that determines ones of the strings which are to be plucked, based on the chord information received from the musical tone generation control apparatus, a notification device that notifies the determined ones of the strings which are to be plucked, and a mute device that mutes ones of the musical tones corresponding to other ones of the strings than the ones of the strings which are to be plucked, notified by the notification device.

To attain the above object, in a fourth aspect of the present invention, there is provided an electronic musical instrument comprising a plurality of operating elements to which a plurality of musical tones are assigned, respectively, a plurality of detector devices provided in association with the operating elements, respectively, for detecting respective operative states of the operating elements, a musical tone-generating device that generates the musical tones assigned to the operating elements, according the detected operative states of the operating elements, and a control device that controls detecting operations of the detector devices, wherein the control device invalidates detecting operations of ones of the detector devices which correspond to ones of the operating elements which are not to be operated.

To attain the above object, in a fifth aspect of the present invention, there is provided a musical tone generation control method of controlling a musical tone generating apparatus including a plurality of operating elements to which a plurality of musical tones are assigned, respectively, and a musical tone-generating device that generates the musical tones, in response to operations of the operating elements to which the musical tones are assigned, respectively, comprising the step of, muting ones of the musical tones assigned to ones of the operating elements which are not to be operated, when the ones of the operating elements which are not to be operated are operated.

Preferably, the musical tone generation control method further comprises the step of notifying ones of the operating elements which are to be operated and the muting step includes muting ones of the musical tones assigned to other ones of the operating elements than the ones of the operating elements which are to be operated, notified by the notification device.

To attain the above object, in a sixth aspect of the present invention, there is provided a program for causing a computer to execute the musical tone generation control method of controlling a musical tone generating apparatus including a plurality of operating elements to which a plurality of musical tones are assigned, respectively, and a musical tone-generating device that generates the musical tones, in response to operations of the operating elements to which the musical tones are assigned, respectively, the musical tone generation control method comprising the step of, muting ones of the musical tones assigned to ones of the operating elements which are not to be operated, when the ones of the operating elements which are not to be operated are operated.

Preferably, the musical tone generation control further comprises the step of notifying ones of the operating elements which are to be operated and the muting step includes muting ones of the musical tones assigned to other ones of the operating elements than the ones of the operating elements which are to be operated, notified by the notification device.

The above and other objects, features, and advantages of the present invention will become more apparent from the following detailed description taken in conjunction with the accompanying drawings.

BRIEF DESCRIPTION OF THE DRAWINGS

FIGS. 4A to 4D are diagrams useful in explaining a mute mechanism of the performance support system in FIG. 1, in which:

FIG. 4A shows a state of the mute mechanism during normal performance;

FIG. 4B shows states of strings of the electronic harp during normal performance;

FIG. 4C shows a state of the mute mechanism during execution of mute control; and FIG. 4D shows states of the strings of the electronic harp during execution of the mute control;

FIGS. 7A and 7B are diagrams useful in explaining a case of plucking strings to generate a chord using the performance support system, in which:

FIG. 7A shows a state of the mute mechanism; and

FIG. 7B shows states of LED light emitters of the performance support system;

DETAILED DESCRIPTION OF THE PREFERRED EMBODIMENTS

The present invention will now be described in detail with reference to the drawings showing a preferred embodiment and variations thereof. In this preferred embodiment and variations, the present invention is applied to a performance support system. The embodiment and variations illustrate examples of various possible forms of the present invention, and therefore can be modified and altered as desired within the spirit and scope of the present invention.

Figure 1:
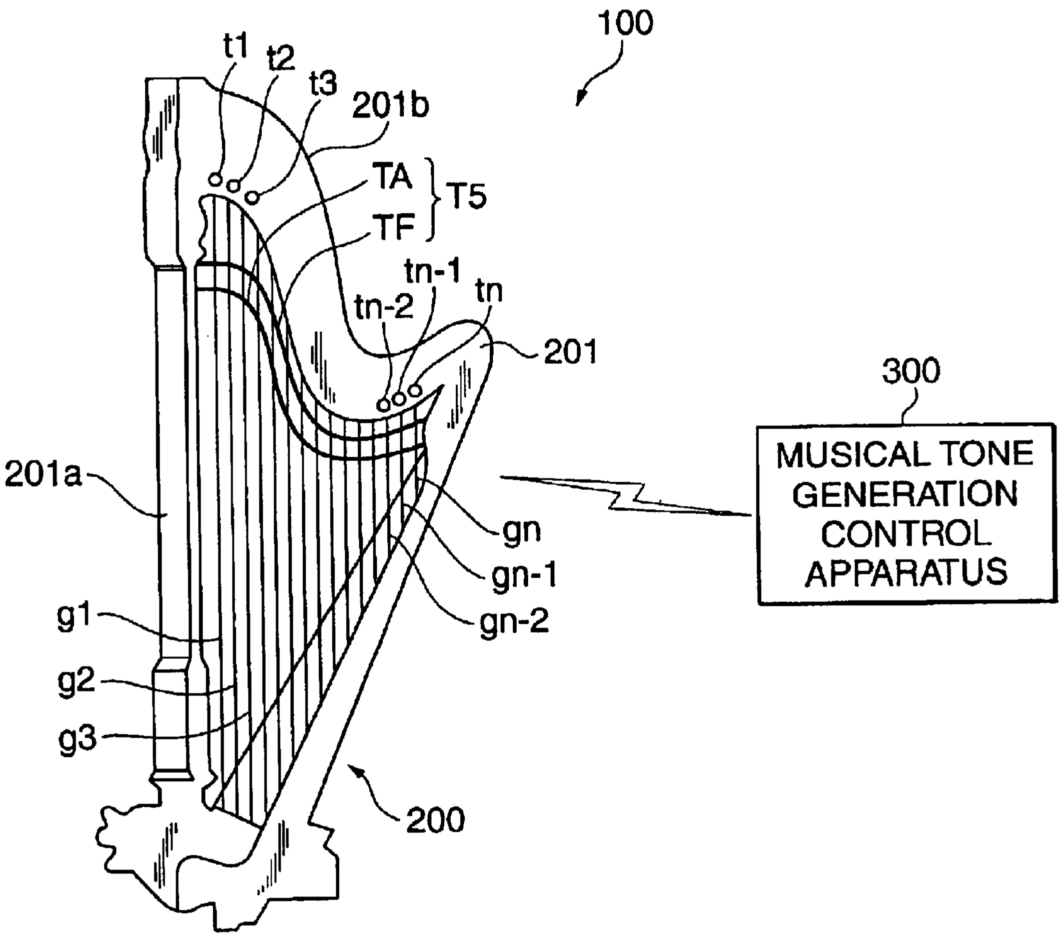
FIG. 1 is a diagram showing the arrangement of a performance support system as a musical tone generating apparatus according to an embodiment of the present invention.

Referring first to FIG. 1, there is shown the arrangement of the performance support system 100 as a musical tone generating apparatus according to an embodiment of the present invention.

The performance support system 100 is intended to be used in a music room, a school, a house, a hall, etc., and is comprised of an acoustic electronic harp (hereinafter simply referred to as "the electronic harp") 200 having a body 201 and a plurality of strings g1 to gn which are strung generally in parallel with a side portion 201*a* of the body 201, and a musical tone generation control apparatus 300.

Figure 2:
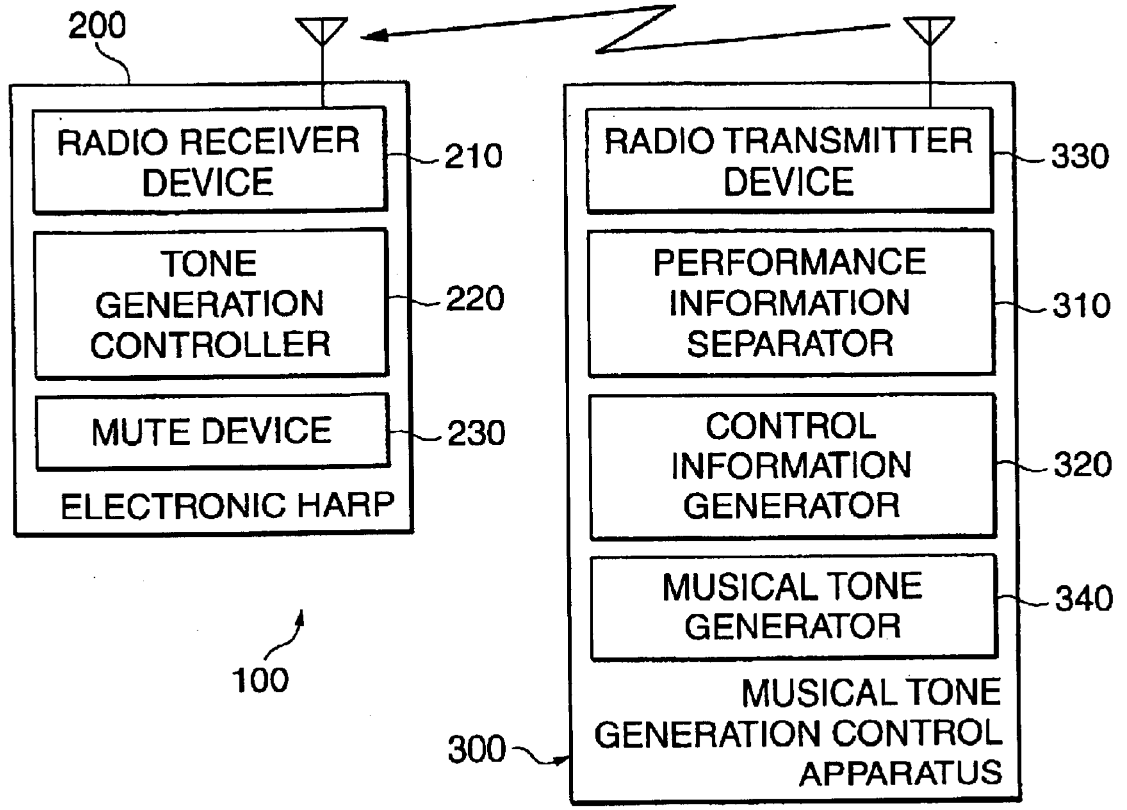
FIG. 2 is a block diagram showing the arrangement of essential functional elements of the performance support system in FIG. 1.

FIG. 2 is a block diagram showing the arrangement of essential functional elements of the performance support system in FIG. 1.

The electronic harp 200 is played by a player using both hands. At least part of the strings g1 to gn strung on the body 201 of the electronic harp 200 are assigned respective different musical tones. The player plucks some or all of the strings to play various chords, etc.

A radio receiver 210 of the electronic harp 200 receives various kinds of control information, referred to hereinafter, which are delivered from the musical tone generation control apparatus 300 to the electronic harp 200.

A tone generation controller 220 of the electronic harp 200 acquires information indicative of a chord to be generated (hereinafter referred to as "chord information") from control information received by the radio receiver 210, and determines which strings to be plucked, based on the acquired chord information. Then, the tone generation controller 220 determines that the other strings than the strings to be plucked should be muted (silenced or damped), and generates mute information indicative of the strings to be muted, followed by outputting the mute information to a mute section 230 of the electronic harp 200.

The mute section 230 is comprised of mute actuators and mute felts, referred to hereinafter with reference to FIGS. 4A to 4D, and executes mute control on each of the strings to be muted, based on the mute information received from the tone generation controller 220. It should be noted that although the following description refers to a case where chord information is transmitted from the musical tone generation control apparatus 300 as an example, the present invention can also be applied e.g. to a case where single tone information indicative of a single tone to be generated is transmitted from the musical tone generation control apparatus 300.

The musical tone generation control apparatus 300 generates tones of parts other than a part corresponding to the electronic harp 200 (hereinafter referred to as "the harp part"), based on music data (MIDI data or the like) for which a reproduction instruction is given.

A performance information separator 310 of the musical tone generation control apparatus 300 separates performance information corresponding to the parts contained in the music data into performance information corresponding to the harp part (hereinafter referred to as "harp-part performance information") and performance information corresponding to the other parts than the harp part (hereinafter referred to as "non-harp-part performance information"). Then, the performance information separator 310 outputs the separated harp-part performance information to a control information generator 320 of the tone generation controller 300, and the separated non-harp-part performance information to a musical tone generator 340 of the same.

The control information generator 320 sequentially generates various control information including the chord information, based on the harp-part performance information separated out by the performance information separator 310. Then, the control information generator 320 sequentially delivers the generated control information to a radio transmitter 330 of the tone generation controller 300 in accordance with the progress of the performance of a piece of music.

When receiving the chord information from the control information generator 320, the radio transmitter 330 radio-transmits the chord information to the electronic harp 200.

When receiving the non-harp-part performance information from the performance information separator 310, the musical tone generator 340 generates performance data based on the non-harp-part performance information. Then, the musical tone generator 340 generates musical tone signals from the generated performance data and carries out musical tone generation.

In the following, a description will be given of the configurations of the electronic harp 200 and the musical tone generation control apparatus 300 for implementing the functions described above.

On an upper portion 201*b* of the body 201 of the electronic harp 200, there are disposed a plurality of LED (Light Emitting Diode) light emitters t1 to tn at respective locations corresponding to the strings g1 to gn (see FIG. 1). The player confirms light emission from one or more of the LED light emitters t1 to tn to thereby recognize one or more strings to be plucked. Further, on the upper portion 201*b* of the body 201, there are disposed a power switch for turning on the electronic harp 200 and other operating switches, referred to hereinafter, for use in executing various settings.

Figure 3:
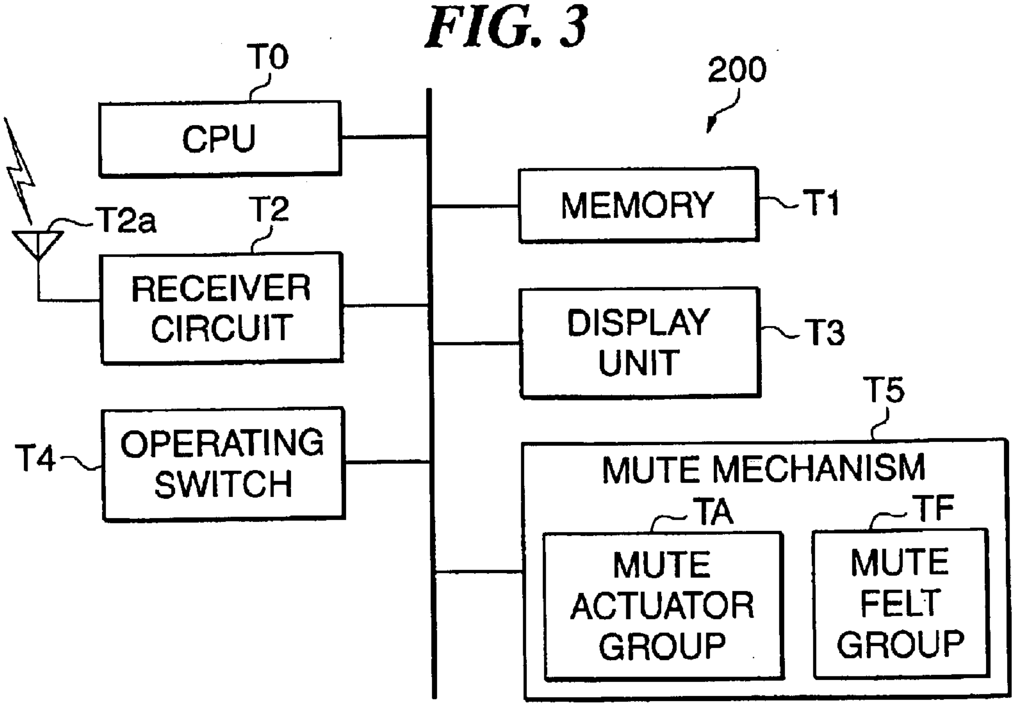
FIG. 3 is a block diagram showing the hardware arrangement of an electronic harp of the performance support system in FIG. 1.

FIG. 3 is a block diagram showing the hardware arrangement of the electronic harp 200 of the performance support system 100.

A CPU (Central Processing Unit) T0 implements the functions of controlling the overall operation of the electronic harp 200, including the function of the tone generation controller 220, based on various control programs stored in a memory T1 (formed by a non-volatile memory, such as a ROM, and a volatile memory, such as a RAM).

More specifically, when receiving control information from the musical tone generation control apparatus 300 via a receiver circuit T2, the CPU T0 acquires chord information from the control information, and determines which strings to be plucked, based on the acquired chord information. Then, the CPU T0 determines that the other strings than the strings to be plucked should be muted (silenced or damped), and generates mute information indicative of the strings to be muted, followed by outputting the mute information to a mute mechanism T5. Further, the CPU T0 performs control for lighting LED light emitters corresponding to the strings to be plucked, based on the results of the above determination.

The receiver circuit T2 is a means for implementing the function of the radio receiver 210, described above, together with the CPU T0, and is comprised of an antenna T2*a*, as well as a high-frequency transmitter, and a power amplifier, neither of which is shown. The receiver circuit T2 receives various control information radio-transmitted from the musical tone generation control apparatus 300.

A display unit T3 includes the LED light emitters t1 to tn described above and a display panel, not shown. The display unit T3 lights LED light emitters corresponding to strings to be plucked, under control of the CPU T0, and displays various information, such as a sensor number, an in-operation state, and power supply alarm. An operating switch T4 represents switches for switching on/off the power supply of the electronic harp 200, setting various operation modes of the same, and so forth. Driving power is supplied to the above components from a battery power supply, not shown, which may be formed by a primary battery, or alternatively by a rechargeable secondary battery.

The mute mechanism T5 is a means for implementing the function of the mute section 230, described above, together with the CPU T0. The mute mechanism T5 is comprised of a mute actuator group TA, and a mute felt group TF arranged on the body 201 at a location close to the upper portion 201*b* of the electronic harp 200, as shown in FIG. 1.

FIGS. 4A to 4D are diagrams useful in explaining the operation of the mute mechanism T5 of the performance support system 100.

As shown in FIGS. 4A to 4D, the mute actuator group TA is comprised of a plurality of mute actuators TA1 to TAn provided in association with the strings g1 to gn, respectively, while the mute felt group TF is comprised of a plurality of mute felts TF1 to TFn provided in association with the strings g1 to gn, respectively.

Figures 4A, 4B, 4C, 4D:
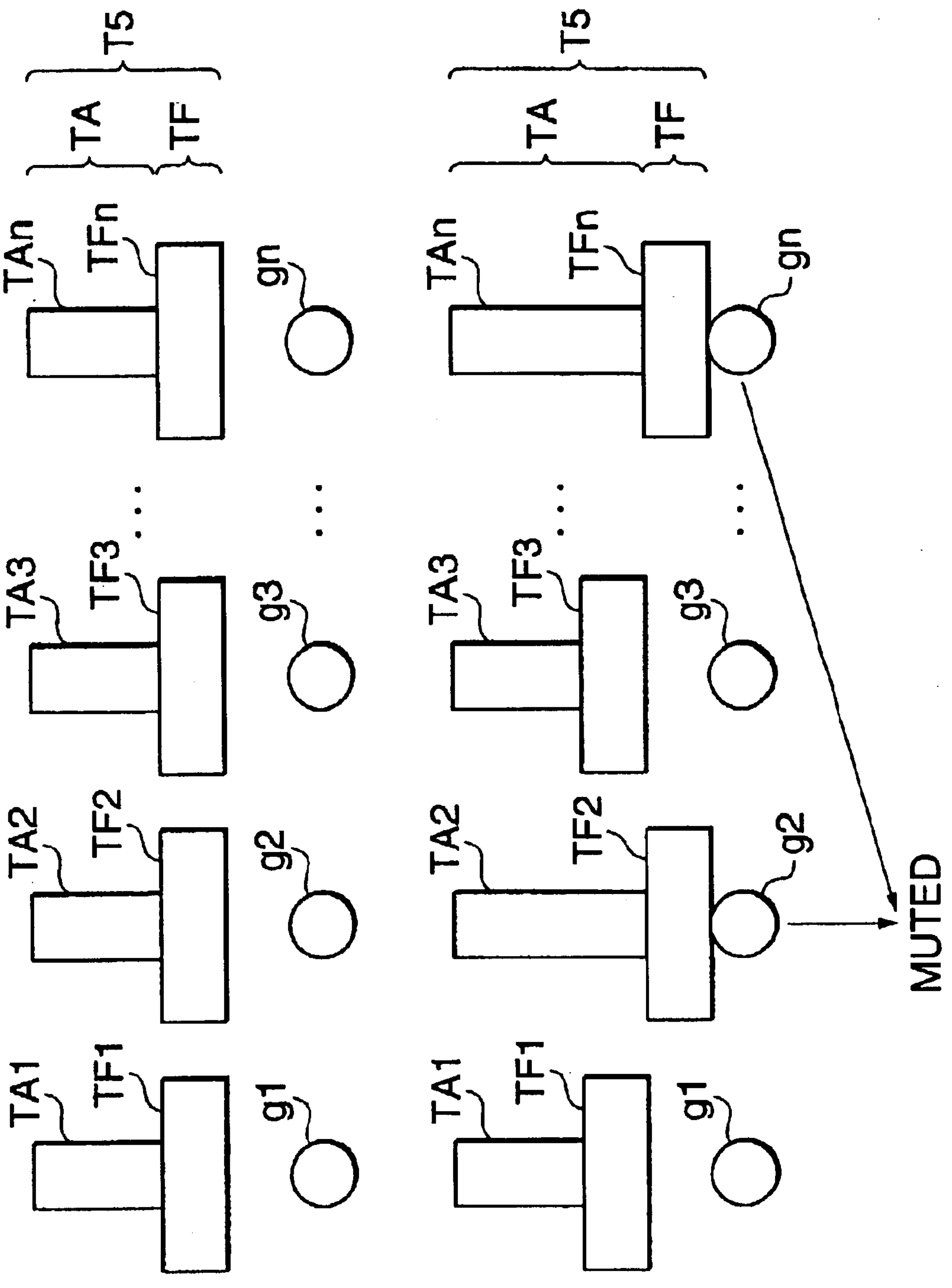

Normally, the mute felts TF1 to TFn are held in respective positions spaced from the strings g1 to gn (see FIGS. 4A, 4B). On the other hand, when any of the mute actuators TA1 to TAn is driven, an associated one of the mute felts TF1 to TFn is pressed against an associated one of the strings g1 to gn (see FIGS. 4C, 4D). The mute actuators TA1 to Tan are driven based on mute information indicative of strings to be plucked, which is supplied from the CPU T0, and accordingly the associated ones of the mute felts (TF2, TFn in the illustrated example) are pressed against the respective associated ones (g2, gn in the illustrated example) of the strings, whereby these strings (g2, gn) are muted.

Further, the mute information contains mute time information indicative of a mute time period, so that corresponding strings (g2, gn in FIG. 4D) are muted just over the mute time period. Alternatively, it may be configured that conversely to the above, normally, the mute felts TF1 to TFn are pressed against the strings g1 to gn, and only when any of the mute actuators (in this case, they should be named "mute-stopping actuators") TA1 to TAn is driven, an associated one of the mute felts TF1 to TFn is released from an associated one of the strings g1 to gn.

Figure 5:
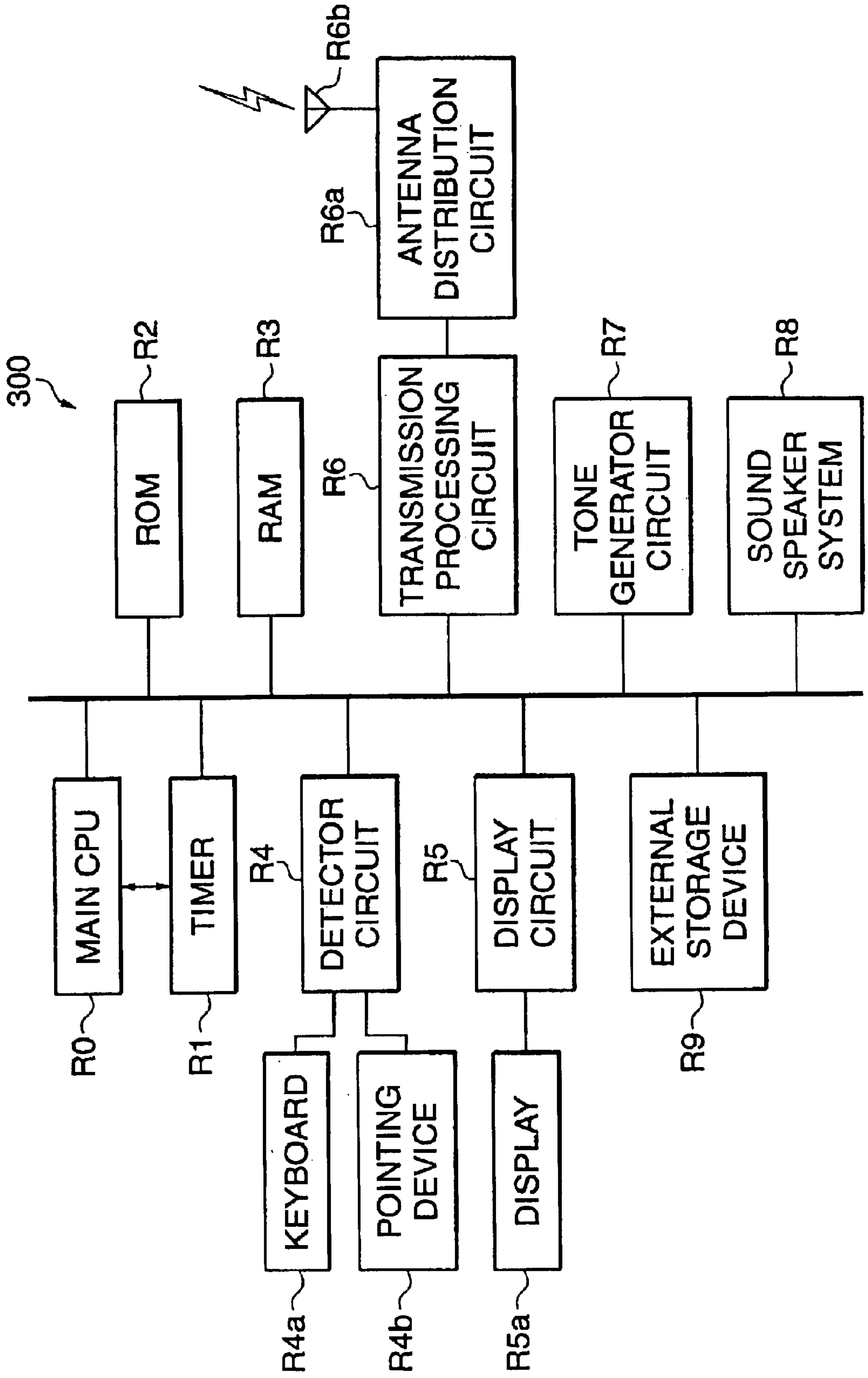
FIG. 5 is a block diagram showing the hardware arrangement of a musical tone generation control apparatus of the performance support system in FIG. 1.

FIG. 5 is a block diagram showing the hardware arrangement of the musical tone generation control apparatus 300 of the performance support system 100.

The musical tone generation control apparatus 300 is implemented by a general-purpose personal computer (hereinafter referred to as the PC) equipped with a sound speaker system R8, a transmission processing circuit R6, and an antenna distribution circuit R6*a* for radio communication with the electronic harp 200, and so forth.

Under time control by a timer R1 for use in generating a tempo clock and an interrupt clock, a main CPU R0 of the musical tone generation control apparatus 300 implements the functions of controlling the overall operation of the musical tone generation control apparatus 300, including the functions of the performance separator section 310 and the control information generator 320, according to predetermined programs.

More specifically, responsive to an instruction for selecting piece-of-music data, e.g. via a detector circuit R4, the main CPU R0 reads out corresponding piece-of-music data from a plurality of piece-of-music data stored e.g. in an external storage device R9. Then, the main CPU R0 separates performance information corresponding to parts contained in the read piece-of-music data into harp-part performance information and non-harp-part performance information. Further, the main CPU R0 generates chord information based on the separated harp-part performance information, and outputs the generated chord information to the transmission processing circuit R6 in accordance with the progress of performance of the piece of music. On the other hand, the separated non-harp-part performance information is delivered to a tone generator circuit R7.

A ROM (Read Only Memory) R2 stores various control programs for controlling the musical tone generation control apparatus 300, including a control program for generating the chord information, and a performance processing program for reproduction control. The ROM R2 also stores various data, tables, etc.

A RAM (Random Access Memory) R3 stores data and parameters necessary for the above processing, and also temporarily stores various data being processed.

Operating elements, such as a keyboard R4*a* and a pointing device R4*b* implemented e.g. by a mouse, are connected to the detector circuit R4, and a display R5*a* is connected to a display circuit R5. This enables the player to perform various setup operations, including setting up various modes necessary for performance data control of the musical tone generation control apparatus 300, and setting tone colors (sound sources) for performance tracks, by operating the keyboard R4*a* and the pointing device R4*b* while viewing various screens displayed on the display R5*a*.

The transmission processing circuit R6 and the antenna distribution circuit R6*a* are means for implementing the function of the radio transmitter 330. The transmission processing circuit R6 performs predetermined signal processing on chord information delivered from the CPU R0, and delivers the processed chord information to the antenna distribution circuit R6*a*. The antenna distribution circuit R6*a* is comprised of a multi-channel high-frequency receiver, not shown, and radio-transmits the chord information supplied from the transmission processing circuit R6 to the electronic harp 200 via an antenna R6*b*.

The tone generator circuit R7 and the sound speaker system R8 are means for implementing the function of the musical tone generator 340. The tone generator circuit R7 is comprised of a DSP (Digital Signal Processor), and generates performance data of parts other than the harp part based on non-harp-part performance information supplied from the main CPU R0 to deliver the generated performance data to the sound speaker system R8. It should be noted that the tone generator circuit R7 is capable of generating performance data for multiple tracks simultaneously according to a sequence program for control of a plurality of channels. The sound speaker system R8 is comprised of amplifiers and speakers, and generates musical tone signals based on the performance data supplied from the tone generator circuit R7 to generate musical tones of the parts other than the harp part.

The external storage device R9 is implemented by a storage device, such as a hard disk drive (HDD), a compact disk read only memory (CD-ROM) drive, a flexible disk drive (FDD), a magneto-optical (MO) disk drive, or a digital versatile disk (DVD) drive, and capable of storing various kinds of data including various control programs and piece-of-music data. Therefore, various programs, such as the performance processing program, necessary for determining performance parameters, changing performance data, and controlling sound reproduction, can be executed not only by using the ROM R2 but also by reading them into the RAM R3 from the external storage device R9 beforehand. Further, results of processing can be recorded in the external storage device R9 as required.

A description will be now given of a case where a player inexperienced in playing a musical instrument plays the electronic harp 200 by using the performance support system 100.

The player who tries to play the electronic harp 200 by using the performance support system 100 turns on the power by operating the keyboard R4*a* or the like of the musical tone generation control apparatus 300 and the operating switch T4 of the electronic harp 200, and then selects a piece of music (e.g. an ensemble piece of music a) to be played, by operating the keyboard R4*a* or the like, as required. When detecting, via the detector circuit R4 or the like, that the ensemble piece of music a has been selected, the main CPU R0 of the musical tone generation control apparatus 300 searches the external storage device R9, etc., to read out piece-of-music data corresponding to the ensemble piece of music a therefrom.

Then, the main CPU R0 separates performance information corresponding to parts contained in the music data read out, into harp-part performance information and non-harp-part performance information. Further, the main CPU R0 generates various control information including chord information, based on the separated harp-part performance information, to deliver the generated control information to the transmission processing circuit R6 in accordance with the progress of performance of the piece of music. On the other hand, the separated non-harp-part performance information is delivered to the tone generator circuit R7. The tone generator circuit R7 generates performance data of parts other than the harp part based on the non-harp-part performance information supplied from the main CPU R0, and generates musical tone signals based on the performance data to deliver the musical tone signals to the sound speaker system R8. As a result, performance tones other than those of the harp part are sequentially sounded through the sound speaker system R8.

On the other hand, the transmission processing circuit R6 carries out predetermined signal processing on the control information, including chord information, sequentially supplied from the main CPU R0, and then transmits the processed control information to the electronic harp 200 via the antenna distribution circuit R6*a*, the antenna 6*b*, etc. When receiving the control information via the receiver circuit T2, the CPU T0 of the electronic harp 200 acquires the chord information from the control information, and determines which strings to be plucked, based on the acquired chord information. Then, the CPU T0 determines that the other strings than the strings to be plucked should be muted, generates mute information indicative of the strings to be muted, and delivers the mute information to the mute mechanism T5 while delivering to the display unit T3 an instruction for lighting LED light emitters corresponding to the strings to be plucked (i.e. which should not be muted).

Figure 6:
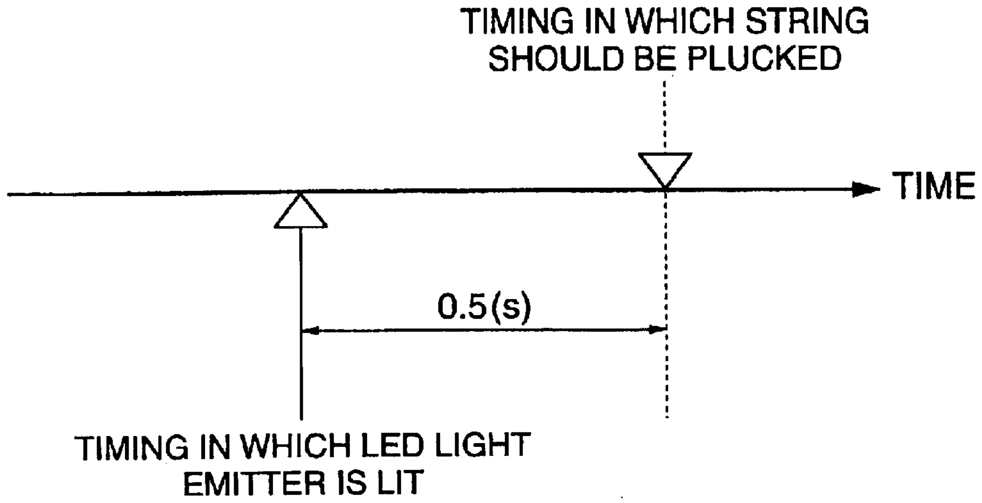
FIG. 6 is a diagram illustrating, by way of example, timing in which an LED light emitter of the performance support system in FIG. 1 is lit, and timing in which a string should be plucked.

FIG. 6 is a diagram illustrating, by way of example, timing in which an LED light emitter corresponding to a string to be plucked is lit, and timing in which a player should actually pluck the string.

In general, a player plucks a string corresponding to a lit-up LED light emitter after having confirmed light emission from the lit-up LED light emitter. Therefore, it is necessary to light an LED light emitter in advanced timing allowing for a simple reaction delay time (approximately 0.5 seconds) which it takes the player to react to a stimulus of light. In other words, it is necessary to light an LED light emitter corresponding to a string to be plucked, in timing earlier by the simple reaction delay time than the timing in which the string is to be plucked.

It should be noted that the timing and duration of light emission by LED light emitters can be adjusted e.g. by properly adjusting timing for transmitting chord information generated by the musical tone generation control apparatus 300, or by properly adjusting timing in which the CPU T0 of the electronic harp 200 sends to the display unit T3 instructions for lighting the LED light emitters corresponding to strings to be plucked. Further, the player can set or change the timing and duration of light emission of LED light emitters, e.g. by operating the operating switch T4.

As is clear from the above description, LED light emitters corresponding to strings to be plucked are lit in timing earlier than timing in which the strings are to be plucked by approximately 0.5 seconds, while the mute mechanism T5 mutes all the strings except the strings to be plucked, based on the mute information supplied from the CPU T0.

Figure 7A:
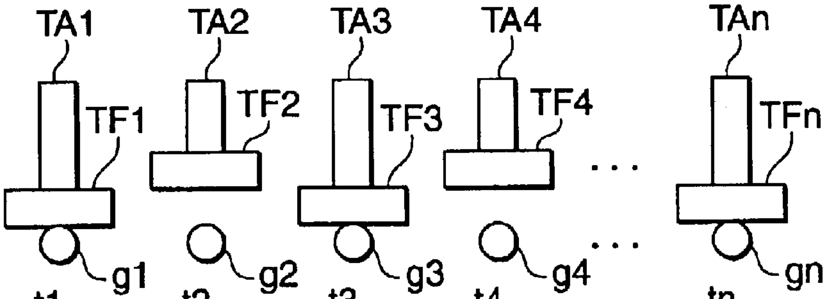
Figure 7B:
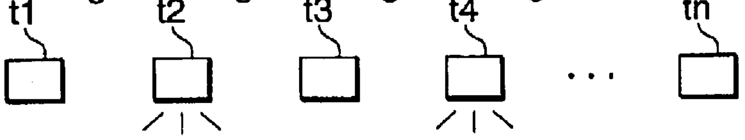

For example, assuming that the chord information received from the musical tone generation control apparatus 300 is a chord a as shown in FIGS. 7A and 7B, and the strings g2, g4 are to be plucked, the CPU T0 generates mute information indicating that all the strings except the strings g2, g4 should be muted, and delivers the mute information to the mute mechanism T5. At the same time, the CPU T0 sends to the display unit T3 an instruction for lighting the LED light emitters t2, t4 corresponding to the strings g2, g4. As a result, all the strings except the strings g2, g4 are muted, and the LED light emitters t2, t4 corresponding to the strings g2, g4 are lit.

Upon recognizing light emission from the LED light emitters t2, t4, the player tries to pluck the corresponding strings g2, g4. However, it is very difficult for a beginner inexperienced in playing the musical instrument to pluck only the strings g2, g4 corresponding to the lit-up LED light emitters t2, t4. The difficulty is such that the beginner is apt to pluck other strings (e.g. strings g1, g3 adjacent to the strings g2, g4) together with the strings g2, g4 to be plucked, even though he/she intends to pluck only the strings g2, g4 corresponding to the lit-up LED light emitters t2, t4.

If the player cannot play the musical instrument as he/she desires, as described above, he/she may be fed up with playing the musical instrument and give up playing the same. According to the electronic harp 200 of the present embodiment, however, even if the player plucks not only the strings g2, g4 corresponding to the lit-up LED light emitters t2, t4 but also other strings g1, g3, no other tones than tones corresponding to the strings g2, g4 are actually sounded since all the strings except the strings g2, g4 are muted.

In other words, even if the player plucks not only the strings g2, g4 corresponding to the lit-up LED light emitters t2, t4 but also the strings g1, g3 which should not be plucked, he/she can cause the proper chord to be sounded. Thus, even beginners quite inexperienced in playing the instrument can cause proper chords to be sounded, which makes it possible to solve the problem that players incapable of playing a musical instrument as intended are fed up with playing the instrument to give up playing the same.

When strings corresponding to LED light emitters which are sequentially lit are plucked by the player as described above, performance tones corresponding to the harp part are sequentially sounded from the electronic harp 200, and performance tones corresponding to the other parts than the harp part are sequentially sounded from the musical tone generation control apparatus 300. Thus, the player can take pleasure in playing the piece of music using the electronic harp 200 and the musical tone generation control apparatus 300.

As is clear from the above description, according to the electronic harp 200 of the present embodiment, LED light emitters corresponding to strings to be plucked are lit based on chord information supplied from the musical tone generation control apparatus 300, so as to notify the player of the strings to be plucked, while the other strings (i.e. the strings which should not be plucked) are muted by the mute mechanism T5. Therefore, even if the player simultaneously plucks the strings corresponding to the lit-up LED light emitters and strings which should not be plucked, musical tones corresponding to the strings which should not be plucked are not sounded. This enables even beginners quite inexperienced in performance of pieces of music to play chords properly, thereby making it possible to solve the problem that players incapable of playing a musical instrument as intended are fed up with playing the instrument to give up playing the same.

The above described embodiment of the present invention has been described only by way of example, and various changes and modifications may be made without departing from the spirit and scope of the present invention. The following are examples of possible variations of the present embodiment.

Figure 8:
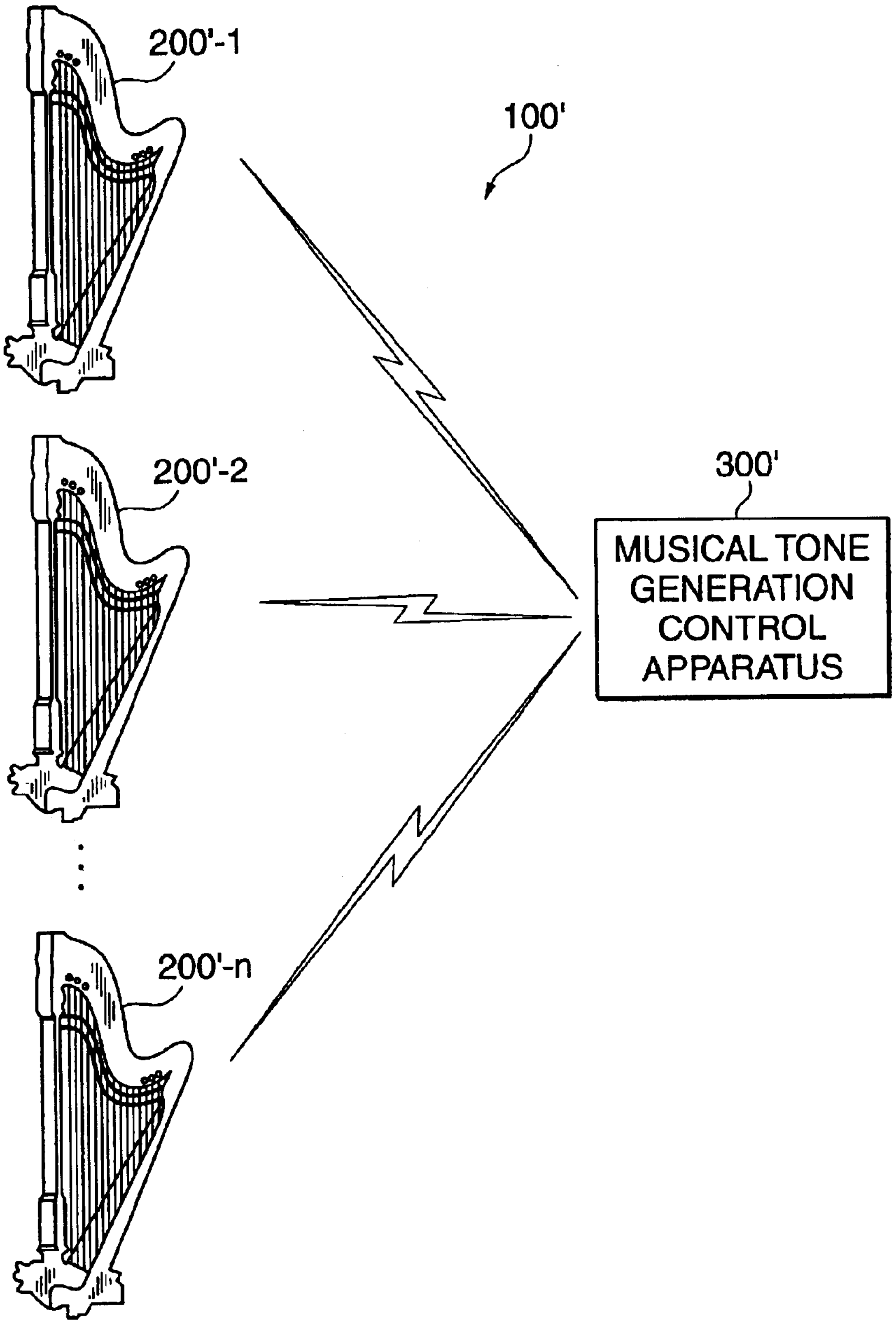
FIG. 8 is a diagram showing the arrangement of a performance support system as a musical tone generating apparatus according to a first variation of the embodiment.
Figure 9:
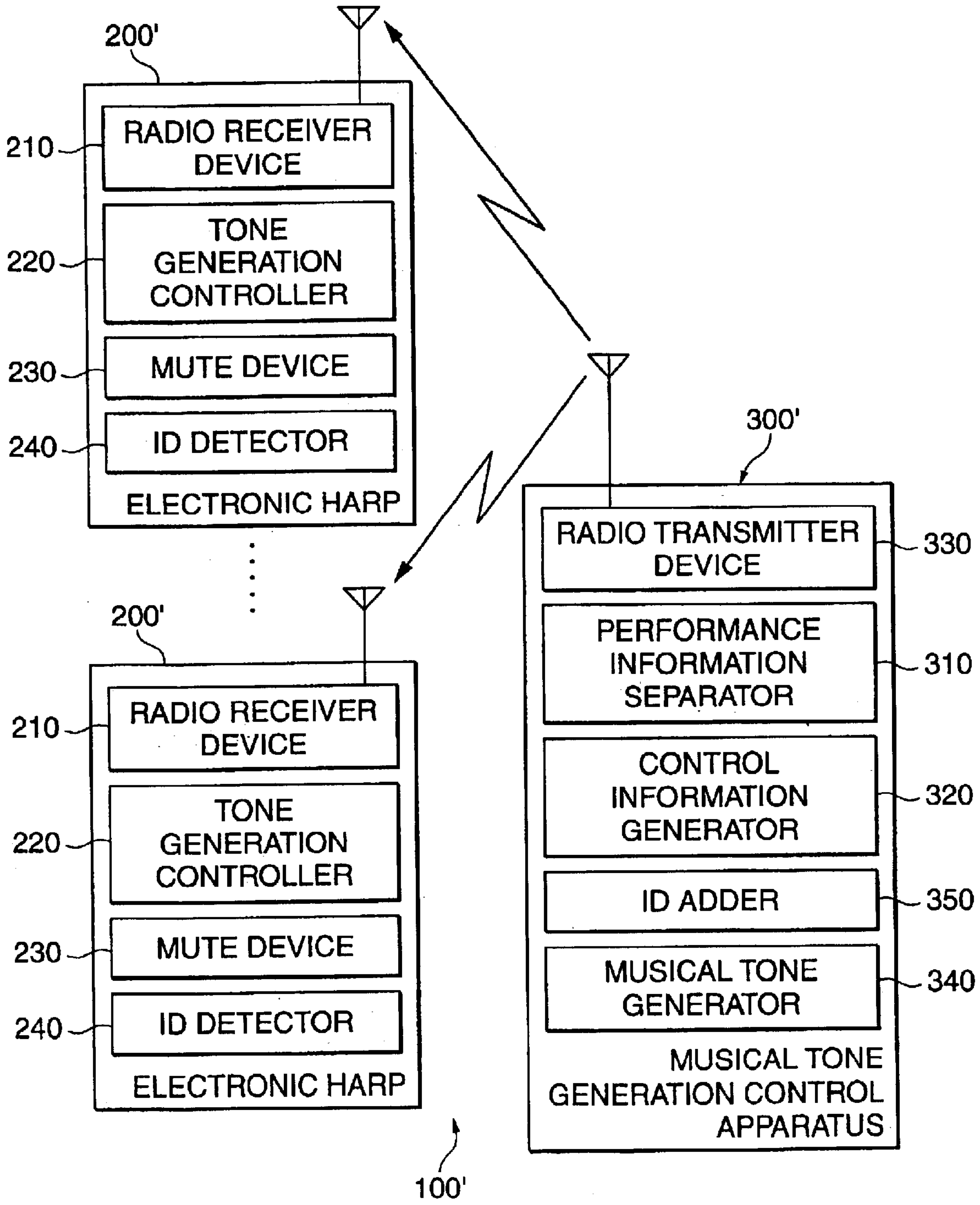
FIG. 9 is a block diagram showing the arrangement of essential functional elements of the performance support system shown in FIG. 8.

FIG. 8 is a diagram showing the arrangement of a performance support system 100' as a musical tone generating apparatus according to a first variation of the embodiment, and FIG. 9 is a block diagram showing block diagram showing the arrangement of essential functional elements of the performance support system 100'.

As shown in FIG. 8, the performance support system 100' according to the first variation is comprised of a plurality of electronic harps 200'-k ($1 \leqq k \leqq n$; hereinafter simply referred to as the electronic harp 200' unless otherwise specified), and a musical tone generation control apparatus 300'. It should be noted that component parts and elements of each electronic harp 200' and the musical tone generation control apparatus 300' corresponding to those of the electronic harp 200 and the musical tone generation control apparatus 300 shown in FIG. 1 are designated by identical reference numerals, and description thereof is omitted.

As shown in FIG. 9, the musical tone generation control apparatus 300' has an ID adder 350 in addition to the functional elements shown in FIG. 2.

The ID adder 350 functions to add to each piece of control information generated by the control information generator 320 electronic harp identification information (hereinafter referred to as "electronic harp ID") for identifying an electronic harp 200' to which the control information piece is to be supplied.

For example, first, the performance information separator 310 of the musical tone generation control apparatus 300' separates performance information corresponding to parts contained in piece-of-music data into harp-part performance information and non-harp-part performance information, and then further divides the harp-part performance information into a plurality of pieces of harp-part performance information. Then, the performance information separator 310 supplies the divided pieces of the harp-part performance information (hereinafter referred to as "the divided harp-part performance information") to the control information generator 320.

The control information generator 320 generates various control information including chord information, based on each piece of the divided harp-part performance information supplied from the performance information separator 310, and supplies the generated control information to the ID adder 350.

The ID adder 350 adds electronic harp ID's to respective pieces of the control information corresponding to the pieces of the divided harp-part performance information and supplied from the control information generator 320, and then supplies the resulting control information to the radio transmitter 330 in accordance with the progress of performance of the piece of music. In this case, the player can freely set or change which piece of the control information should be assigned to which electronic harp 200', by carrying out set-up operation. It should be noted that the radio transmitter 330 and the musical tone generator 340 of the present variation are substantially the same in function as those of the above embodiment, and therefore description thereof is omitted.

On the other hand, as shown in FIG. 9, each electronic harp 200' has an ID detector 240 in addition to the functional elements shown in FIG. 2.

The ID detector 240 acquires an electronic harp ID added to control information received by the radio receiver 210, and then searches the memory T1 by using the acquired electronic harp ID as a retrieval key. The memory T1 of each electronic harp 200' stores an electronic harp ID for identifying the electronic harp 200'. The ID detector 240 performs comparison between the acquired electronic harp ID and the electronic harp ID stored in the memory T1, and notifies the result of the comparison to the tone generation controller 220.

Based on the notification from the ID detector 240, the tone generation controller 220 determines whether or not chord information and other data should be generated, depending upon the control information supplied from the radio receiver 210. More specifically, if agreement between the compared ID's is notified, the tone generation controller 220 generates chord information and other data based on the control information. On the other hand, if disagreement between the compared two ID's is notified, the tone generation controller 220 terminates processing without generating chord information and other data based on the control information. It should be noted that the configurations and operations of the tone generation controller 220 and the mute section 230 of the present variation are substantially the same in function as those of the above embodiment, and therefore description thereof is omitted.

As described above, according to the performance support system 100' of the first variation, it is possible to play an ensemble piece of music or the like by using a plurality of electronic harps 200' and the musical tone generation control apparatus 300'. Further, the use of the performance support system 100' described above makes it possible to realize ensemble performance by a plurality of electronic harps 200'. For example, a first player plays a first harp part using an electronic harp 200'-1, a second player plays a second harp part using an electronic harp 200'-2, . . . , and an n-th player plays an n-th harp part using an electronic harp 200'-n. In this case, it is possible to play harp parts alone using the plurality of electronic harps, without playing non-harp parts (e.g. a piano part, etc.).

Next, a second variation of the embodiment will be described.

Although in the above embodiment, LED light emitters are employed as means for notifying the player of strings to be plucked, any indicator means (e.g. a liquid crystal panel which displays the respective numbers of strings to be plucked) that enables a player to visually recognize strings to be plucked can be used. Further, in place of or in combination with the indicator means, such as LED light emitters, vibrator means (such as vibration motors) may be provided for notifying a player of strings to be plucked, by vibration. In short, any notification means that enables a player to recognize strings to be plucked can be employed.

Next, a third variation of the embodiment will be described.

Although in the above embodiment, live tones (natural tones) are sounded by a player plucking strings, this is not limitative, but, for example, electronic tone generator means (e.g. a tone generator circuit) and detector means (e.g. vibration pickups) for detecting vibrations of the strings strung on the electronic harp 200 may be provided in the electronic harp 200 to cause the electronic harp 200 to generate electronic musical tones having a tone pitch and a volume dependent on the results of detection by the vibration pickups. In this case, in place of the mute information, pickup detection-invalidating information, for example, may be generated for determining ones of the vibration pickups whose detection of vibrations is invalidated, thereby allowing electronic musical tones to be generated only based on the results of detection by ones of the vibration pickups corresponding to strings to be plucked. As a result, even if a player plucks strings which should not be plucked, electronic musical tones corresponding to the strings are not sounded, and therefore, similarly to the above embodiment, the present variation makes it possible to solve the problem that players incapable of playing a musical instrument as intended are fed up with playing the instrument to give up playing the same.

Next, a fourth variation of the embodiment will be described.

Although in the above embodiment, an inexperienced beginner or like player plays the electronic harp 200, the present invention can also be applied to a case where an experienced player plays the electronic harp 200.

Figure 10:
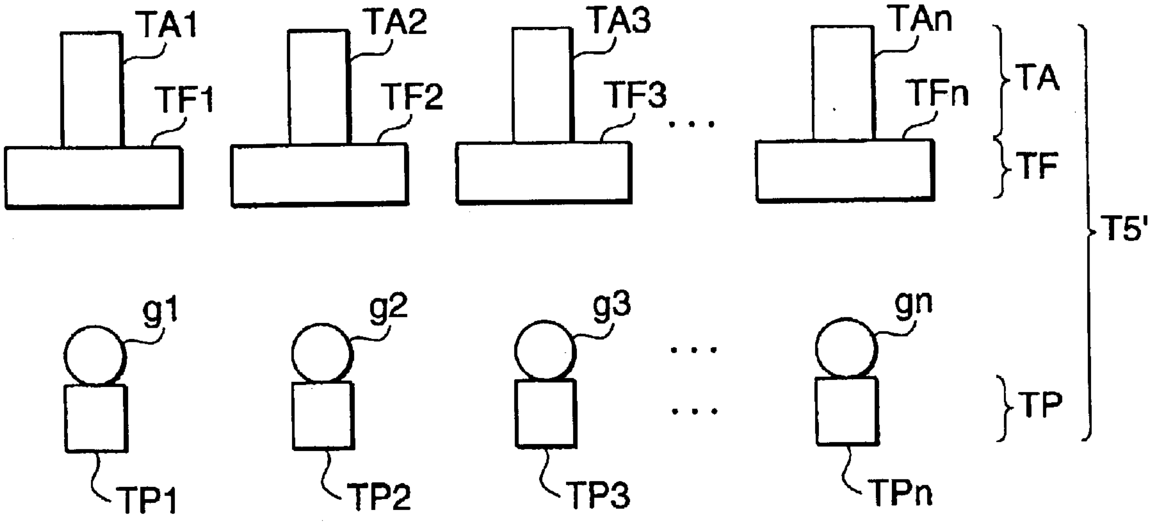
FIG. 10 is diagrams useful in explaining a mute mechanism of a performance support system as a musical tone generating apparatus according to a fourth variation of the embodiment.

FIG. 10 is diagrams useful in explaining a mute mechanism T5' of an electronic harp 200 as a musical tone generating apparatus according to the fourth variation of the embodiment. The mute mechanism T5' of the present variation has a vibration pickup group TP in addition to the mute actuator group TA and the mute felt group TF of the performance support system 100 in FIG. 1.

The vibration pickup group TP is comprised of a plurality of vibration pickups TP1 to TPn disposed in association with the strings g1 to gn, respectively. In the case of an experienced player playing the electronic harp 200, the mute actuators TA1 to Tan are not driven, and therefore the strings g1 to gn are all held in a released state (i.e. a non-mute state). This performance mode is set e.g. by a player operating the operating switch T4 of the electronic harp 200 or the keyboard R4*a* of the musical tone generation control apparatus 300 as required.

A player who plays a predetermined piece of music (e.g. a harp piece of music) using the electronic harp 200 constructed as described above plucks strings of the electronic harp 200 to a motif in his/her mind. When a string is plucked by the player, a vibration pickup provided in association with the plucked string detects the timing and intensity of plucking the string, and delivers the detected timing and intensity to the CPU T0 as performance timing information and performance intensity information. The CPU T0 transmits the received performance timing information and performance intensity information to the musical tone generation control apparatus 300 via a transmitter circuit, not shown, and a transmitting antenna, not shown. When receiving the performance timing information and the performance intensity information from the electronic harp 200 via a receiving antenna, not shown, and a receiver circuit, not shown, the main CPU R0 of the musical tone generation control apparatus 300 determines the tempo of the player's performance from the performance timing information, and the volume of sound of the electronic harp 200 from the performance intensity information. Then, the main CPU R0 controls the tempo of reproduction of parts other than the harp part in accordance with the determined tempo of the player's performance, and controls the volume of sound of the parts other than the harp part according to the determined volume of sound of the electronic harp 200.

As a result, even when the player plays the electronic harp 200 to a motif in his/her mind, it is possible to obtain an accompaniment that matches the performance of the piece of music by the electronic harp 200. In other words, in the case of playing the electronic harp 200 accompanied by performance of the parts other than the harp part (non-harp-part performance) by the musical tone generation control apparatus 300, the player can actively play by controlling the non-harp-part performance by his/her own performance of the electronic harp 200, instead of passively playing the electronic harp 200 in accordance with the non-harp-part performance. Although in the fourth variation, the vibration pickups are provided for the respective strings, vibrations of strings may be detected by one or more piezoelectric elements, one or more acceleration sensors, or the like, and the intensity of plucking strings (i.e. volume) may be detected by one or more small-sized microphones.

Next, a fifth variation of the embodiment will be described.

Although in the above embodiment, the electronic harp 200 is used as an example of the electronic musical instrument, the present invention may be applied e.g. to any plucked string instrument having a plurality of strings strung thereon, such as a musical instrument belonging to a zither group with many strings strung generally in parallel with each other on the front surface of a log-shaped or box-shaped body, or a musical instrument belonging to a lyre group with two support arms extending from an elongate body thereof and strings strung from a yoke connecting the two support arms to one end of the body via bridges arranged on the front surface of the body.

In addition to the above plucked string instruments, the present invention is also applicable to any musical instrument insofar as it is capable of generating different musical tones in response to an operation by a player, such as an acoustic piano which generates natural (acoustic) musical tones in response to a key operation by a player, or an electronic piano which generates electronic musical tones in response to a key operation by a player.

Figure 11:
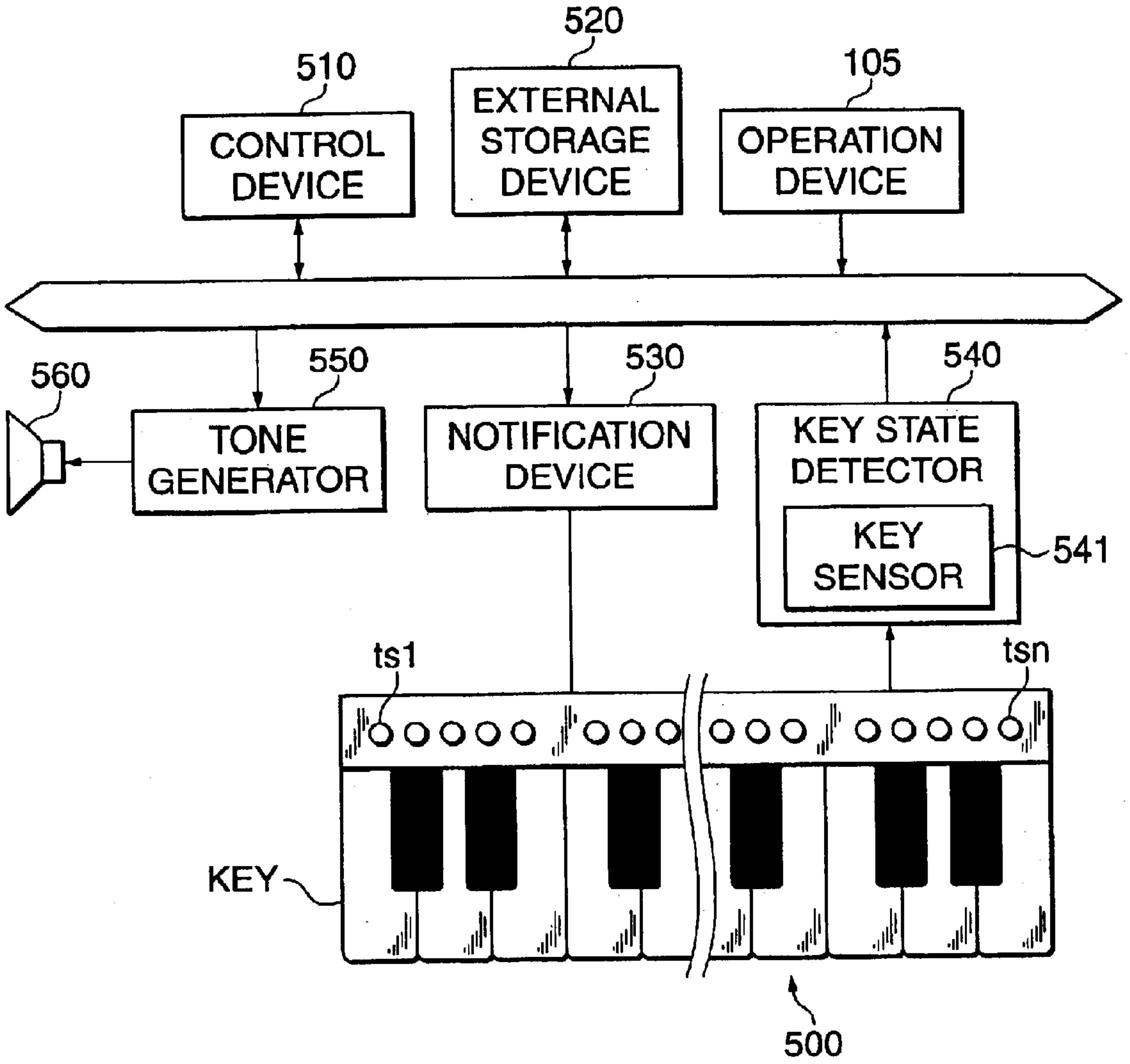
FIG. 11 is a diagram showing the arrangement of an electronic keyboard instrument of a performance support system as a musical tone generating apparatus according to a fifth variation of the embodiment.

FIG. 11 is a diagram showing the arrangement of an electronic keyboard instrument 500 of a performance support system as a musical tone generating apparatus according to the fifth variation of the present embodiment.

The electronic keyboard instrument 500 is constructed such that key operations by a player are detected and then musical tones are generated in response to the detected key operations.

As shown in FIG. 11, the electronic keyboard instrument 500 includes a controller 510 that is comprised of a CPU, a ROM, and a RAM, and executes control programs stored in the ROM as required, to thereby centrally control the components of the electronic keyboard instrument 500.

An external storage device 520 of the electronic keyboard instrument 500 includes a storage medium, such as an FD and a CD-ROM, storing piece-of-music data and other data associated with performance of pieces of music, and a drive that reads out the piece of music data from the storage medium. Piece-of-music music data is read out from the external storage device 520 in response to instructions from the controller 510.

A notification section 530 is comprised of a plurality of LED light emitters ts1 to tsn disposed in association with respective keys (e.g. 88 keys). Under the control of the controller 510, the notification section 530 sequentially lights LED light emitters associated with keys to be depressed by the player in accordance with the progress of performance of a piece of music.

A key state detector 540 is comprised of key sensors 541 provided for respective keys, for detecting a state (key-on, key-off, etc.) of each key.

Figure 12:
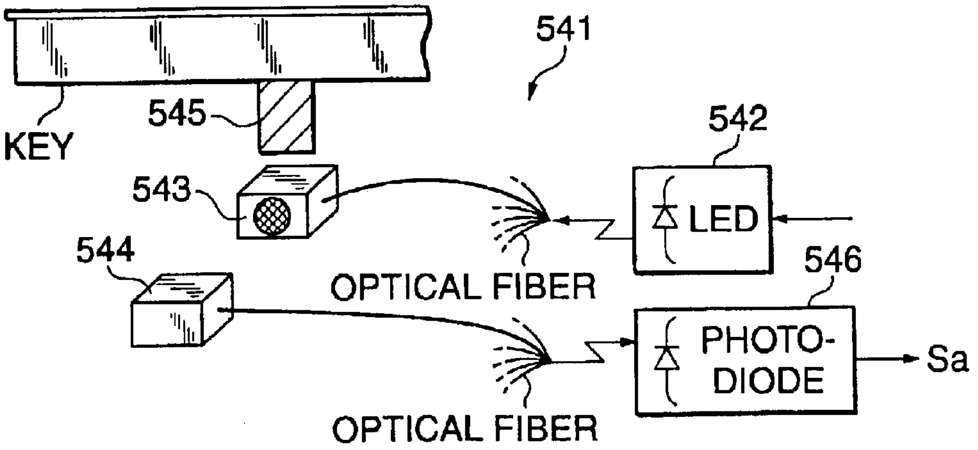
FIG. 12 is a diagram showing the arrangement of a key sensor of the performance support system in FIG. 11.

As shown in FIG. 12, each key sensor 541 is comprised e.g. of an LED 542 that emits light for detection, a light-emitting-side sensor head 543 that emits the light supplied from the LED 542 via an optical fiber, a light-receiving-side sensor head 544 that receives the light emitted from the light-emitting-side sensor head 543 and outputs the light via an optical fiber, a plate-like shutter 545 mounted on the underside surface of each key, and a photodiode 546 that converts the light output from the light-receiving-side sensor head 544 to an output signal Sa. The output signal Sa output from each photodiode 546 is supplied to the controller 510, and the controller 510 generates MIDI data based on the results of detection by the key sensors 541. The generated MIDI data is supplied to a tone generator 550. It should be noted that the detecting operation of each key sensor 541 is controlled by the controller 510.

The tone generator 550 generates musical tone signals based on the MIDI data supplied from the controller 510, and outputs the generated musical tone signals to a loudspeaker 560 via an amplifier, not shown, thereby generating electronic tones.

An operator 105 is comprised of switches for switching on/off the power supply of the electronic keyboard instrument 500, various settings, and so forth.

Figure 13:
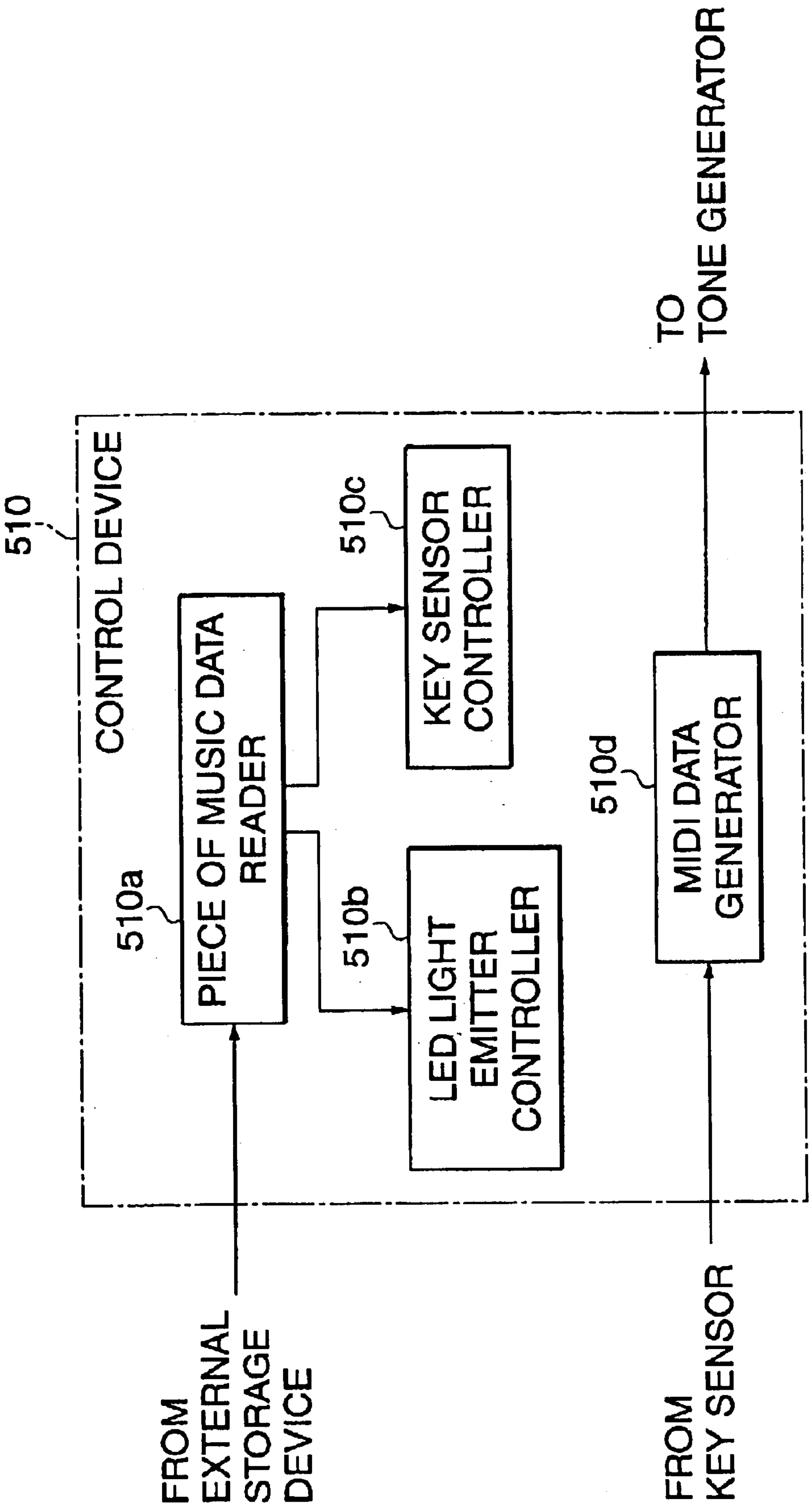
FIG. 13 is a block diagram showing the arrangement of essential functional elements of a control device of the performance support system in FIG. 11.

FIG. 13 is a functional block diagram showing the arrangement of essential functional elements of the controller 510 of the performance support system according to the fifth variation.

A piece-of music-data reader 510*a* of the controller 510 sequentially reads out piece-of-music data selected by the player, e.g. from the external storage section 520 under time control by a timer, not shown, and sequentially outputs the piece-of-music data to an LED light emitter controller 510*b* and a key sensor controller 510*c*.

The LED light emitter controller 510*b* provides control based on the piece-of-music data sequentially supplied from the piece-of-music data reader 510*a* such that LED light emitters (e.g. the LED light emitter ts1 and others) associated with keys to be depressed are lit in timing earlier than the timing in which the keys are to be depressed, by simple reaction delay time (see the related part of the description of the above embodiment).

The key sensor controller 510*c* provides control based the piece-of-music data sequentially supplied from the piece-of-music data reader 510*a* such that only detecting operations of key sensors 541 associated with keys are validated and detecting operations of the other key sensors 541 are invalidated.

A MIDI data generator 510*d* receives output signals Sa from the key sensors 541 whose detecting operations have been validated by the key sensor controller 510*c*, and detects key depression intensity, key number, etc. of each of the keys from the received output signals Sa. Then, the MIDI data generator 510*d* generates MIDI data based on results of the detection, and supplies the generated MIDI data to the tone generator 550. The tone generator 550 converts the MIDI data to musical tone signals, which are then sounded as electronic musical tones through the speaker 560.

By virtue of the function of the controller 510 described above, even if a player simultaneously depresses not only keys corresponding to lit-up LED light emitters but also keys which should not be depressed, only tones from the keys corresponding to the lit-up LED light emitters, i.e. tones of the keys to be operated for sounding are output as electronic musical tones through the speaker 560, similarly to the above embodiment. This enables even a beginner quite inexperienced in musical performance to play the instrument properly, thereby making it possible to solve the problem that players incapable of playing a musical instrument as intended are fed up with playing the instrument to give up playing the same.

The present invention may either be applied to a system composed of a plurality of apparatuses or to a single apparatus.

It is to be understood that the functions of the electronic harp 200, the musical tone generation control apparatus 300, the electronic keyboard instrument 500, and so forth, described above, can also be realized by software. It also goes without saying that the object of the present invention may be accomplished by supplying a system or an apparatus with a storage medium in which a program code of software which realizes the functions of any of the above described embodiment and variations, and causing a computer (CPU or MPU) of the system or apparatus to read out and execute the program code stored in the storage medium.

In this case, the program code itself read from the storage medium realizes the functions of any of the above described embodiment and variations, and hence the storage medium on which the program code is stored constitutes the present invention.

Examples of the storage medium for supplying the program code include a floppy (registered trademark) disk, a hard disk, an optical disk, a magneto optical disk, a CD-ROM, a CD-R, a CD–RW, a DVD-ROM, a DVD-RAM, a DVD−RW, a DVD+RW, a magnetic tape, a nonvolatile memory card, and a ROM. Downloading via a network can also be utilized.

Further, it is to be understood that the functions of any of the above described embodiment and variations may be accomplished not only by executing a program code read out by a computer, but also by causing an OS (operating system) or the like which operates on the computer to perform a part or all of the actual operations based on instructions of the program code.

Further, it is to be understood that the functions of any of the above described embodiment and variations may be accomplished by writing a program code read out from the storage medium into a memory provided on an expansion board inserted into a computer or in an expansion unit connected to the computer and then causing a CPU or the like provided in the expansion board or the expansion unit to perform a part or all of the actual operations based on instructions of the program code.

What is claimed is:

1. A musical tone generating apparatus comprising:

a plurality of operating elements to which a plurality of musical tones are assigned, respectively;

a musical tone-generating device that generates the musical tones, in response to operations of said operating elements to which the musical tones are assigned, respectively; and a mute device that mutes ones of the musical tones assigned to ones of said operating elements which are not to be operated, in accordance with progress of performance of a niece of music.

2. A musical tone generating apparatus according to claim 1, further comprising a notification device that notifies ones of said operating elements which are to be operated, and wherein said mute device mutes ones of the musical tones assigned to other ones of said operating elements than the ones of said operating elements which are to be operated, notified by said notification device, in accordance with oroaress of performance of a piece of music.

3. A musical tone generating apparatus according to claim 2, wherein said notification device notifies the ones of said operating elements which are to be operated and timing of operations thereof in accordance with progress of performance of a piece of music, and wherein said mute device mutes the ones of the musical tones assigned to the other ones of said operating elements than the ones of said operating elements which are to be operated, notified by said notification device, over a predetermined time period.

4. A plucked string instrument comprising:

a musical tone-generating device including a plurality of strings, said musical tone-generating device generating musical tones corresponding to ones of said strings which are operated, respectively; and a mute device that mutes ones of the musical tones corresponding to ones of said strings which are not to be plucked.

5. A plucked string instrument according to claim 4, further comprising a notification device that notifies ones of said strings which are to be plucked, and wherein said mute device mutes ones of the musical tones corresponding to other ones of said strings than the ones of said strings which are to be plucked, notified by said notification device.

6. A plucked string instrument according to claim 5, wherein said notification device notifies the ones of said strings which are to be plucked and timing of plucking thereof in accordance with progress of performance of a piece of music, and wherein said mute device mutes ones of the musical tones corresponding to the other ones of said strings than the ones of said strings which are to be plucked, notified by said notification device, over a predetermined time period.

7. A performance system comprising:

a plucked string instrument including a plurality of strings, said plucked string instrument generating musical tones corresponding to ones of said strings which are operated, respectively; and a musical tone generation control apparatus that generates chord information indicative of chords to be sounded by said plucked string instrument, wherein said musical tone generation control apparatus includes a transmitter device that transmits the generated chord information to said plucked string instrument, and wherein said plucked string instrument includes a musical tone generation control device that determines ones of said strings which are to be plucked, based on the chord information received from said musical tone generation control apparatus, a notification device that notifies the determined ones of said strings which are to be plucked, and a mute device that mutes ones of the musical tones corresponding to other ones of said strings than the ones of said strings which are to be plucked, notified by said notification device.

8. An electronic musicai instrument comprising:

a plurality of operating elements to which a plurality of musical tones are assigned, respectively;

a plurality of detector devices provided in association with said operating elements, respectively, for detecting respective operative states of said operating elements;

a musical tone-generating device that generates the musical tones assigned to said operating elements, according the detected operative states of said operating elements; and a control device that controls detecting operations of said detector devices, wherein said control device invalidates detecting operations of ones of said detector devices which correspond to ones of said operating elements which are not to be operated.

9. A musical tone generation control method of controlling a musical tone generating apparatus including a plurality of operating elements to which a plurality of musical tones are assigned, respectively, and a musical tone-generating device that generates the musical tones, in response to operations of the operating elements to which the musical tones are assigned, respectively, comprising the step of:

muting ones of the musical tones assigned to ones of said operating elements which are not to be operated, when the ones of said operating elements which are not to be operated are operated, in accordance with oroaress of oerformance of a piece of music.

10. A musical tone generation control method according to claim 9, further comprising the step of notifying ones of said operating elements which are to be operated and wherein said muting step includes muting ones of the musical tones assigned to other ones of the operating elements than the ones of said operating elements which are to be operated, notified by said notification device, in accordance with progress of performance of a piece of music.

11. A program for causing a computer to execute a musical tone, generation control method of controlling a musical tone generating apparatys including a plurality of operating elements to which a plurality of musical tones are assigned, respectively, and a musical tone-generating device that generates the musical tones, in response to operations of the operating elements to which the musical tones are assigned, respectively, the musical tone generation control method comprising the step of:

muting ones of the musical tones assigned to ones of the operating elements which are not to be operated, when the ones of the operating elements which are not to be operated are operated, in accordance with oroaress of performance of a piece of music.

12. A program according to claim 11, wherein the musical tone generation control further comprises the step of notifying ones of the operating elements which are to be operated and wherein the muting step includes muting ones of the musical tones assigned to other ones of the operating elements than the ones of the operating elements which are to be operated, notified by the notification device, in accordance with progress of performance of a piece of music.

* * * * *

UNITED STATES PATENT AND TRADEMARK OFFICE

CERTIFICATE OF CORRECTION

PATENT NO. : 6,803,512 B2
APPLICATION NO. : 10/458908
DATED : October 12, 2004
INVENTOR(S) : Kenji Ishida et al.

It is certified that error appears in the above-identified patent and that said Letters Patent is hereby corrected as shown below:

Column 17, Line 32, Claim 1 “niece” should be --piece--
Column 17, Line 39, Claim 2 “oroaress” should be --progress--
Column 18, Line 32, Claim 8 “musicai” should be --musical--
Column 18, Line 61, Claim 9 “oroaress” should be --progress--
Column 18, Line 62, Claim 9 “oerformance” should be --performance--
Column 19, Line 7, Claim 11 “apparatys” should be --apparatus--
Column 20, Line 2, Claim 11 “oroaress” should be --progress--

Signed and Sealed this

Fifth Day of February, 2008

Jon W. Dudas

JON W. DUDAS
*Director of the United States Patent and Trademark Office*